United States Patent [19]

Hardy et al.

[11] Patent Number: 5,343,012
[45] Date of Patent: Aug. 30, 1994

[54] DIFFERENTIALLY PUMPED TEMPERATURE CONTROLLER FOR LOW PRESSURE THIN FILM FABRICATION PROCESS

[76] Inventors: Walter N. Hardy; Qiyuan Ma, both of The University of British Columbia Office of Research Services and Industry Liaison, 2194 Health Sciences Mall, Room 331, I.R.C. Building, Vancouver, British Columbia, Canada, V6T 1W5

[21] Appl. No.: 956,958

[22] Filed: Oct. 6, 1992

[51] Int. Cl.⁵ .......................... C23C 14/00; H05B 3/00
[52] U.S. Cl. ................................. 219/443; 392/418; 118/725; 427/592
[58] Field of Search ............... 219/443, 462; 392/416, 392/418; 118/724, 725, 728; 165/80.1; 427/592, 593

[56] References Cited

U.S. PATENT DOCUMENTS

| | | | |
|---|---|---|---|
| 4,508,161 | 4/1985 | Holden | 118/724 |
| 4,542,298 | 9/1985 | Holden | 250/443.1 |
| 4,603,466 | 8/1986 | Morley | 165/80.5 |
| 4,615,755 | 10/1986 | Tracy et al. | 204/298 |
| 4,628,991 | 12/1986 | Hsiao et al. | 165/80.2 |
| 4,949,783 | 8/1990 | Lakios et al. | 165/80.1 |
| 4,969,511 | 11/1990 | Person . | |
| 5,059,770 | 10/1991 | Mahawili | 219/464 |
| 5,171,398 | 12/1992 | Miyamoto | 269/21 |
| 5,238,499 | 8/1993 | van de Ven et al. | 118/724 |

OTHER PUBLICATIONS

Research Disclosure 321105, Jan. 10, 1991 (anonymous).
High Temperature Resistive Substrate Heater, undated advertising brochure of US Inc.

Primary Examiner—Bruce A. Reynolds
Assistant Examiner—John A. Jeffery
Attorney, Agent, or Firm—Oyen Wiggs Green & Mutala

[57] ABSTRACT

The temperature of a substrate on which a thin film structure is to be fabricated in a low pressure environment is controlled by supporting the substrate on a heater block having a rim which defines first and second regions between the substrate and the heater block. The first region is inside the rim. The second region is outside the rim, surrounding the first region. Heat is applied to the heater block and an inert gas having good thermal conductivity is pumped through the block into the first region at a first controlled pressure. Gas is pumped away from the second region at a second pressure substantially less than the first pressure. A pressure differential is thus maintained between the two regions. This prevents the inert gas from contaminating the thin film fabrication environment by escaping past the substrate into the fabrication environment.

6 Claims, 2 Drawing Sheets

DIFFERENTIALLY PUMPED TEMPERATURE CONTROLLER FOR LOW PRESSURE THIN FILM FABRICATION PROCESS

FIELD OF THE INVENTION

This application pertains to a method and apparatus for controlling the temperature of a thin film fabrication substrate by maintaining a pressure differential between a first region into which gas passes through a substrate-supporting heater block to heat the substrate and a second region surrounding the first region from which gas is withdrawn.

BACKGROUND OF THE INVENTION

Thin film fabrication techniques are becoming essential aspects of many advanced technology manufacturing operations. In particular, thin film semiconductor fabrication techniques have been used for decades. Newer techniques employing gallium arsenide ("GaAs") and other semiconductor materials are being developed to exploit the high speed and other superior performance properties of such materials. Recent advances in superconducting devices made from high critical temperature ("$T_c$") ceramic compounds have necessitated development of new processes for fabricating, annealing and testing exotic materials. Such processes include pulsed laser ablation, single target sputtering, multi-element co-sputtering, metallo-organic chemical vapour deposition ("MOCVD"), molecular beam epitaxy ("MBE"), electron beam co-evaporation, reactive sputtering and etching, and various other processes.

Many of these processes involve chemical reactions, partial pressures, etc. which are highly temperature dependant. Accordingly, the temperature of the thin film fabrication process must be carefully controlled. For example, thin films are conventionally fabricated at operating temperatures ranging from about 600° C. to about 900° C., with the operating temperature being ideally controlled within a tolerance range of about ±1° C. to ±5° C. In practice however, the absolute operating temperature cannot economically be measured with the desired precision, so a relative temperature is used instead. Thus, the temperature is often controlled by reference to a "tracking" variable such as a thermocouple readout, with the optimal process temperature being determined empirically by evaluating the quality of successive batches of finished thin films and iteratively adjusting the associated value of the tracking variable until acceptable quantities of thin films of acceptable quality are produced.

A further problem is that it is difficult to reliably obtain a good thermal connection between the thermocouple and the substrate on which the thin film is fabricated. Consequently, the absolute value of the temperature of the substrate may be known only to within about ±10° C. Thus, even if it is possible to control the process temperature to within ±1° C., such accurate temperature control resolution can not be applied effectively. More importantly however, the fabrication of uniform quality thin films over the entire substrate requires that the temperature of the substrate be uniformly controlled over the entire substrate. The larger the substrate, the more stringent this control must become and the more difficult it is to attain.

In most epitaxial deposition processes currently in use, the substrate on which thin film structures are to be fabricated is mounted in a support holder which is attached to a thermally massive heater block. A good thermal connection to the block is achieved by using a heat conducting medium such as indium solder or silver paste to bond the substrate to the block. This causes two major problems. First, the bond is often non-uniform across the substrate. Second, after fabrication of the thin film structures on the substrate, the bond must be broken to free the substrate from the heater block (i.e. by physically prying the substrate away from the block).

These problems impose production limitations which inhibit widespread use of thin film fabrication techniques in comparison to other techniques such as those used to fabricate silicon devices. For example, a non-uniform bond between a 50 mm diameter substrate and the heater block may cause temperature variations of several degrees across the substrate, making it impossible to fabricate thin film structures of uniformly high quality over the entire substrate. The fragility of the substrate material results in significant breakage loss when the bond is broken to remove the substrate from the block. Breakage loss escalates rapidly as the diameter of the substrate increases above about 50 mm. Large diameter substrates are preferably utilized in order to maximize yield and minimize cost, but the breakage factor limits the size of substrates which can practically be accommodated in many fabrication processes.

A further problem is that the mechanical bonding of one side of the substrate to the heater block renders that side of the substrate unsuitable for thin film fabrication. This precludes double-sided thin film fabrication of the sort commonly encountered in microwave device fabrication, which greatly constrains the design of the circuits capable of fabrication by thin film techniques.

The foregoing problems have restricted the use of various thin film fabrication processes, limited the yields attainable by those processes, and added greatly to their complexity and expense. However, if the foregoing problems can be overcome, many of these processes offer significant potential benefits in the fabrication of thin film microcircuits. The present invention is accordingly directed to overcoming such problems.

SUMMARY OF THE INVENTION

In accordance with the preferred embodiment, the invention provides a method of controlling the temperature of a substrate on which a thin film structure is to be fabricated in a low pressure or other environment requiring the substrate to be held at a controlled temperature. The substrate is supported on a heater block having a rim which defines a first region between the substrate and the heater block inside the rim, and a second region between the substrate and the heater block outside the rim. The second region surrounds the first region. Heat is applied to the heater block and an inert gas of high thermal conductivity is introduced into the first region by allowing the gas to pass through apertures in the heater block at a first, controlled pressure. The gas acts as a good thermal conductor between the heater block and the substrate. Vacuum is applied to withdraw gas from the second region at a second pressure substantially less than the first pressure. A pressure differential is thus maintained between the first and second regions, preventing the inert gas from contaminating the thin film fabrication environment by escaping past the substrate into the fabrication environment.

In some applications of the invention, a higher vacuum may be applied to withdraw gas from a third region surrounding the second region at a third pressure substantially less than the second pressure. This establishes a further pressure differential barrier to prevent the inert gas from contaminating the thin film fabrication environment.

The invention also provides apparatus for controlling the temperature of a thin film fabrication substrate. The apparatus incorporates a heater block having a rim for supporting the substrate. A first aperture is provided in the block to conduct an inert gas of high thermal conductivity through the block to the first region mentioned above. A second aperture in the block conducts gas through the block away from the second region mentioned above. A pressure controlled gas source supplies gas to the first region at a first, controlled pressure, while a first pumping means pumps gas away from the second region at a second pressure substantially less than the first pressure. A third aperture may be provided in the block to conduct gas through the block away from the third region mentioned above, with a second pumping means being provided to pump gas away from the third region at a third pressure substantially less than the second pressure.

DETAILED DESCRIPTION OF THE PREFERRED EMBODIMENT

Figure 1:
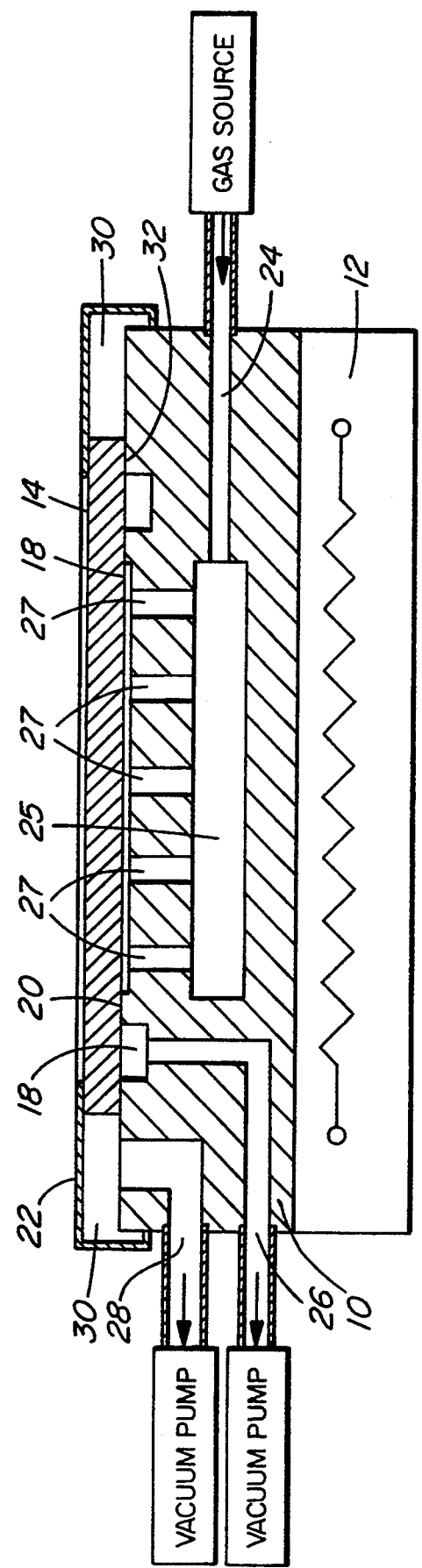
FIG. 1 is a dimensionally distorted, cross-sectional side elevation view of a differentially-pumped temperature controller constructed in accordance with the preferred embodiment of the invention.
Figure 2:
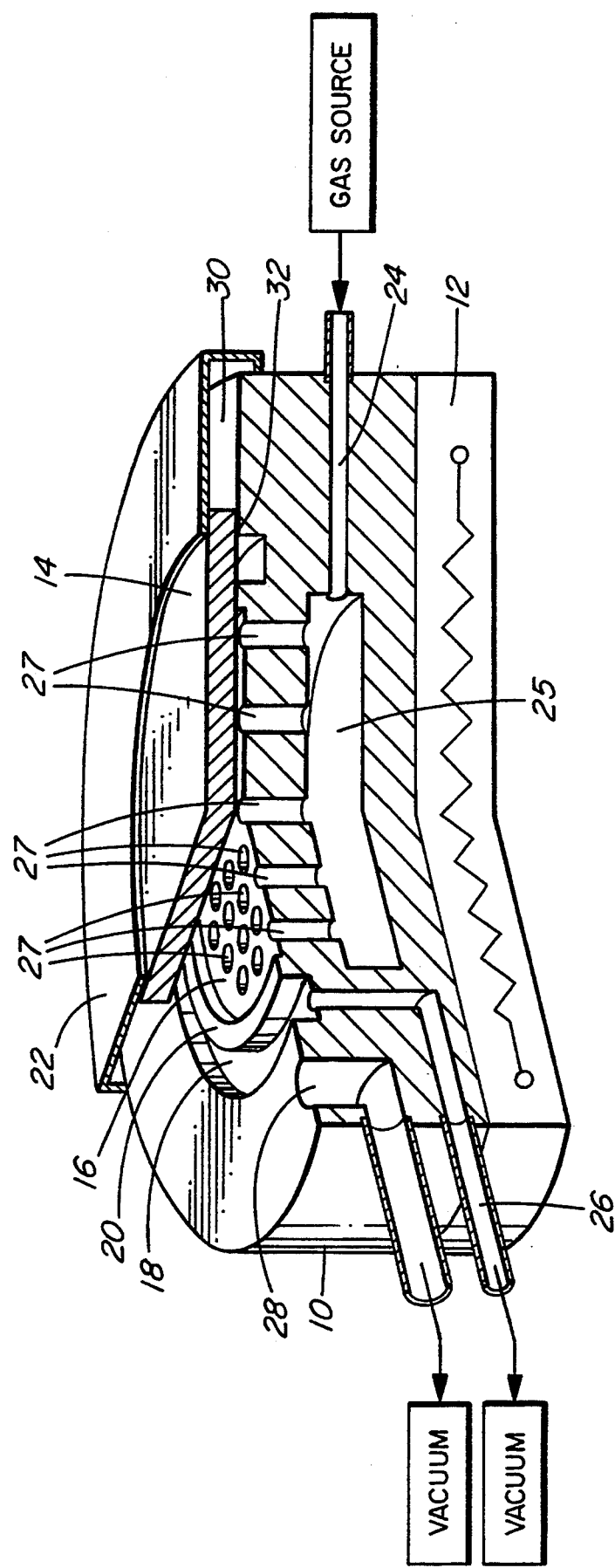
FIG. 2 is a perspective view of the apparatus depicted in FIG. 1.

As depicted in the drawings, heater block 10 is mounted atop electric powered heating element 12. Block 10 is made of a material compatible with a thin film semiconductor fabrication environment. The top surface of block 10 is milled and lapped to a flatness comparable to that of wafer substrate 14 on which thin film structures are to be fabricated by a process such as metallo-organic chemical vapour deposition ("MOCVD"), molecular beam epitaxy ("MBE"), reactive sputtering and etching, etc. A first circular region 16 is machined to a depth of a few microns in the top surface of heater block 10. A second annular region 18 is machined in the top surface of heater block 10, around first region 16, leaving a rim 20 between first and second regions 16, 18. Accordingly, when substrate 14 is clamped atop block 10 by clamp 22, rim 20 supports substrate 14 with first and second regions 16, 18 lying between substrate 14 and block 10.

A first aperture 24 is machined in block 10 to conduct a high thermal conductivity inert gas such as helium or hydrogen through block 10 from a pressure-controlled gas source (not shown) into gas reservoir chamber 25. A large plurality of small apertures 27 in block 10 permit the gas to pass from chamber 25 into first region 16 (the drawings illustrate only a few such apertures, and greatly exaggerate their size). Apertures 27 ensure that the gas pressure within first region 16 (hereafter the "first pressure") is uniform and equal to the gas pressure within chamber 25, which is in turn governed by the pressure-controlled gas source. The thermal conductance of the gas within first region 16 is accordingly uniform throughout first region 16. All points on the underside of substrate 14 which are exposed to first region 16 are thus maintained at a temperature very close to the temperature of heater block 10.

A second aperture 26 is machined in block 10 to conduct gas away from second region 18, through block 10 toward a first high vacuum pumping means (not shown) such as a turbopump or a dry pump capable of sustaining, for example, pressures on the order of $10^{-7}$ torr. The first high vacuum pumping means maintains the pressure within second region 18 at a second pressure substantially less than the first pressure within first region 16.

If required in order to meet cleanliness specifications of the thin film the fabrication process, a third aperture 28 may be provided in block 10 to conduct gas through block 10 away from a third region 30 between the top surface of block 10 and clamp 22. In such case a second pumping means (not shown) is provided to pump gas away from third region 30 at a third pressure substantially less than the second pressure within second region 18.

The first, second and third pressures may vary over a wide range, depending upon the nature of the particular fabrication process carried out on substrate 14, but the relative pressure differentials are maintained as aforesaid. That is, the second pressure is always substantially less than the first pressure; and, if a second pumping means is provided, then the third pressure is always substantially less than the second pressure.

In operation, substrate 14 is laid atop block 10 such that rim 20 supports substrate 14 around its lower circumference, with the underside of substrate 14 covering first and second regions 16, 18. Clamp 22 is positioned over substrate 14 and used to securely clamp substrate 14 in place on block 10. Heating element 12 is then activated to raise the temperature of block 10 to its normal operating temperature for thin film fabrication (typically in the range of about 600° C. to about 900° C.).

After the temperature of heater block 10 has stabilized, helium or hydrogen gas is introduced into first aperture 24, which conducts the gas through heater block 10 as aforesaid, thereby preheating the gas to a temperature close to the temperature of block 10. The preheated gas emerges from aperture 24 into chamber 25 and then passes through apertures 27 into first region 16, as aforesaid. The hot gas in first region 16 forms a thin layer between the underside of substrate 14 and the flat upper surface of heater block 10. The uniform thermal conductance of the gas in region 16 maintains substrate 14 at a uniform temperature close to that of heater block 10.

To prevent contamination of the thin film fabrication environment atop substrate 14 the gas must not be allowed to escape from first region 16 into the thin film fabrication environment. This is achieved by establishing a series of "barriers" which present progressively higher impedance to passage of the gas, while simultaneously providing a series of "escape conduits" which present much lower impedance to passage of the gas than the corresponding high impedance barrier. These barriers and escape conduits constitute a "differential pumping" means capable of establishing a large differential between the pressure in each of conduits 24, 26, 28.

More particularly, rim 20 presents a first high impedance barrier to gas flow, preventing most of the gas from escaping from first region 16 into second region 18. If some gas does overcome the first barrier and escape into second region 18, it encounters a second barrier 32 where the outer edge of substrate 14 contacts heater block 10. Gas escaping past the first barrier into second region 18 also encounters a much lower pressure within second region 18 than the pressure within first region 16, due to the high vacuum applied to second aperture 26 by the first pumping means. Accordingly, gas in second region 18 tends to escape from second region 18 through second aperture 26, which acts as a low impedance "escape conduit", rather than escaping past the much higher impedance second barrier 32. If any gas escapes past second barrier 32 into third region 30, it encounters clamp 22 which acts as a third high impedance barrier to passage of the gas. Gas escaping past second barrier 32 into third region 30 also encounters a lower pressure within third region 30 than the pressure within second region 18, due to the differential manner of operation of the second pumping means, whereby an even higher vacuum is applied to third aperture 28 than is applied by the first pumping means to second aperture 26. Accordingly, gas in third region 30 tends to escape therefrom through third aperture 28, which acts as a low impedance "escape conduit", rather than escaping past the much higher impedance barrier presented by clamp 22.

It will be understood that, in order to achieve the desired high impedance to gas passage, the top surface of the first barrier (i.e. rim 20) must be precisely level with the top surface of second barrier 32. Otherwise, substrate 14 (which is itself made flat with a high degree of precision) will not properly contact all points along both barriers. Those skilled in the art will understand that conventional machining techniques can readily be used to make both barriers smooth and level to a tolerance of much less than one micron. The actual tolerances required for the surfaces depend upon the application, specifically upon the way in which any residual escaping gas may affect the particular fabrication process employed. The tolerances may also ultimately depend on the purity of the inert gas used, because contaminants in the gas may adversely affect the quality of fabricated thin films to a much greater extent than the inert gas itself.

By carefully regulating the pressure of the gas within first region 16, one may attain uniformly optimal thermal conductance within first region 16 and thereby attain correspondingly uniform heat transfer to all points on substrate 14 which are exposed to first region 16. Since the hot gas reservoir (i.e. chamber 25) is a single large cavity, it is relatively easy to regulate the gas pressure and keep it uniform.

In general, the pressure in the film fabrication region atop substrate 14 will be much lower than that in first region 16. Under these conditions, a relatively large pressure in region 16 will cause substrate 14 to distort outwardly (i.e. away from heater block 10). Therefore, it is generally preferable to maintain the lowest possible pressure in first region 16 that will provide good thermal conductance. The optimal pressure is that pressure at which one mean free path length for an average molecule or atom of the inert gas is equal to the separation between the flat upper surface of block 10 and the lower surface of substrate 14. Higher pressures may be allowed in cases where a higher pressure (e.g., 0.1 torr) processing environment is used.

The invention eliminates the need for bonding substrate 14 to block 10. This in turn eliminates contamination of one side of the substrate with bonding material, and also eliminates the use of force to break a bond in order to remove substrate 14 from block 10 after fabrication is complete. The invention should not limit the diameter of substrate which could be accommodated, with the possible exception at some point of flatness considerations and wafer flexing. The invention may thus facilitate uniform heating of substrates as large as those currently used in silicon VLSI device fabrication (diameter ≈ 150 mm) without surface contamination and with zero loss of yield due to separation breakage or processing temperature non-uniformity across the substrate.

As will be apparent to those skilled in the art in the light of the foregoing disclosure, many alterations and modifications are possible in the practice of this invention without departing from the spirit or scope thereof. Accordingly, the scope of the invention is to be construed in accordance with the substance defined by the following claims.

What is claimed is:

1. A method of controlling the temperature of a substrate for thin film fabrication on said substrate in a low pressure environment, said method comprising the steps of:
   a) supporting said substrate on a heater block rim to define:
      (i) a first region between said substrate and said heater block inside said rim;
      (ii) a second region between said substrate and said heater block outside said rim, said second region surrounding said first region;
   b) heating said heater block;
   c) introducing an inert gas of high thermal conductivity into said first region through said heater block at a controlled first pressure;
   d) withdrawing gas from said second region by applying a second pressure substantially less than said first pressure to said second region; and
   e) withdrawing gas from a third region surrounding said second region by applying a third pressure substantially less than said second pressure to said third region.

2. A method as defined in claim 1, wherein said rim separates said substrate from said block by a distance substantially equal to one mean free path length of an average molecule or atom of said gas.

3. Apparatus for controlling the temperature of a thin film fabrication substrate, said apparatus comprising:
   a) a heater block having a rim for supporting said substrate above a first region;
   b) a source of highly thermally conductive gas maintained at a first, controlled pressure;
   c) a first aperture in said block for gas communication from said source, through said block, into a gas reservoir within said block;
   d) a plurality of apertures for gas communication from said reservoir into said first region;
   e) a second aperture in said block for gas communication through said block from a second region between said substrate and said block, outside said rim;
   f) first pumping means for pumping gas away from said second region at a second pressure substantially less than said first pressure;
   g) a third aperture in said block for gas communication through said block from a third region surrounding said second region; and h) second pumping means for pumping gas away from said third region at a third pressure substantially less than said second pressure.

4. Apparatus as defined in claim 3, wherein said rim separates said substrate from said block by a distance substantially equal to one mean free path length of an average molecule or atom of said gas.

5. A method of controlling the temperature of a substrate of thin film fabrication on said substrate in a low pressure environment, said method comprising the steps of:

a) supporting said substrate on a heater block rim to define:

i) a first high impedance barrier to passage of gas between said substrate and said rim from a first region beneath said substrate;

ii) a second high impedance barrier to gas passage between said rim and an outer edge of said substrate, said second barrier surrounding said first barrier;

b) heating said heater block;

c) introducing an inert gas of high thermal conductivity into said first region through said heater block at a first, controlled pressure;

d) applying vacuum to a second region between said first and second barriers at a second pressure substantially less than said first pressure to provide a low impedance path for withdrawal of said gas from said second region;

e) establishing a third high impedance barrier to gas passage between an outer edge of said substrate and said thin film fabrication environment, said third barrier surrounding said second barrier; and, f) applying vacuum to a third region between said second and third barriers at a third pressure substantially less than said second pressure to present a low impedance path for withdrawal of said gas from said third region.

6. A method as defined in claim 5, wherein said rim separates said substrate from said block by a distance substantially equal to one mean free path length of an average molecule or atom of said gas.

* * * * *